US009877390B2

(12) United States Patent
Takemura et al.

(10) Patent No.: US 9,877,390 B2
(45) Date of Patent: Jan. 23, 2018

(54) MULTILAYER SUBSTRATE AND METHOD FOR MANUFACTURING THE SAME

(71) Applicant: Murata Manufacturing Co., Ltd., Kyoto (JP)

(72) Inventors: Kazuhiko Takemura, Kyoto (JP); Kazuhiro Isebo, Kyoto (JP); Yutaka Fukuda, Kyoto (JP); Yoshikazu Oikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/141,080

(22) Filed: Apr. 28, 2016

(65) Prior Publication Data

US 2016/0242287 A1 Aug. 18, 2016

Related U.S. Application Data

(63) Continuation of application No. PCT/JP2014/077634, filed on Oct. 17, 2014.

(30) Foreign Application Priority Data

Nov. 7, 2013 (JP) .................................. 2013-230759

(51) Int. Cl.
*H05K 1/11* (2006.01)
*H01L 23/498* (2006.01)
(Continued)

(52) U.S. Cl.
CPC ............ *H05K 1/115* (2013.01); *H01L 21/486* (2013.01); *H01L 23/49827* (2013.01);
(Continued)

(58) Field of Classification Search
CPC ......... H05K 2201/09827; H05K 1/115; H05K 2201/09563; H05K 2201/09845; H05K 1/113
(Continued)

(56) References Cited

U.S. PATENT DOCUMENTS

2008/0315431 A1* 12/2008 Ahn ........................ H01L 23/13
257/774
2009/0084588 A1* 4/2009 Sekine .............. H01L 21/76898
174/257

(Continued)

FOREIGN PATENT DOCUMENTS

JP  H08-236891 A  9/1996
JP  2000-012736 A  1/2000
(Continued)

OTHER PUBLICATIONS

JP 2000-012736 English Translation.*
(Continued)

*Primary Examiner* — Steven T Sawyer
(74) *Attorney, Agent, or Firm* — Pearne & Gordon LLP

(57) ABSTRACT

A multilayer substrate including a multilayer body formed by laminating a plurality of insulating layers including via holes in the insulating layer as an uppermost layer of the multilayer body so as to pass through the insulating layer, and via conductors formed by filling the via holes with a conductive paste. The via holes are formed through lower end positions, upper end positions, and intermediate positions between the lower end positions and the upper end positions such that a diameter enlargement degree toward the upper end positions from the intermediate positions is larger than a diameter enlargement degree toward the intermediate positions from the lower end positions. By forming the via holes as described above, when the via holes are filled with the conductive paste from openings at the small (Continued)

diameter side of the via holes, exudation of the conductive paste from openings at the large diameter side is prevented.

14 Claims, 4 Drawing Sheets

(51) Int. Cl.
*H01L 21/48* (2006.01)
*H05K 3/00* (2006.01)
*H05K 1/02* (2006.01)
*H05K 1/03* (2006.01)
*H05K 3/40* (2006.01)

(52) U.S. Cl.
CPC ......... *H05K 1/0298* (2013.01); *H05K 1/0306* (2013.01); *H05K 3/0032* (2013.01); *H05K 3/4038* (2013.01); *H01L 2224/16225* (2013.01); *H01L 2924/19105* (2013.01); *H05K 1/113* (2013.01); *H05K 3/4069* (2013.01); *H05K 2201/09827* (2013.01); *H05K 2201/09854* (2013.01); *H05K 2203/0191* (2013.01); *H05K 2203/1476* (2013.01)

(58) Field of Classification Search
USPC .................................................. 174/261–264
See application file for complete search history.

(56) References Cited

U.S. PATENT DOCUMENTS

| | | | | |
|---|---|---|---|---|
| 2009/0255722 A1* | 10/2009 | Lee | ......................... | H05K 1/116 174/264 |
| 2010/0078210 A1* | 4/2010 | Korthuis | ................. | G02F 1/167 174/262 |
| 2010/0307807 A1* | 12/2010 | Noda | ................... | H05K 3/0032 174/264 |
| 2012/0145445 A1* | 6/2012 | Arai | .................. | H01L 23/49827 174/260 |
| 2013/0146349 A1* | 6/2013 | Lee | ......................... | H05K 1/115 174/262 |
| 2013/0153279 A1* | 6/2013 | Hayashi | ............... | H05K 3/4673 174/260 |

FOREIGN PATENT DOCUMENTS

| | | |
|---|---|---|
| JP | 2001-119139 A | 4/2001 |
| JP | 2003-197811 A | 7/2003 |
| JP | 2003-332716 A | 11/2003 |
| JP | 2008-300482 A | 12/2008 |
| JP | 2009-117564 A | 5/2009 |
| JP | 2010-287879 A | 12/2010 |

OTHER PUBLICATIONS

English translation TDK Corp (JP2009-200356).*
International Search Report issued in Application No. PCT/JP2014/077634 dated Dec. 9, 2014.
Written Opinion issued in Application No. PCT/JP2014/077634 dated Dec. 9, 2014.

* cited by examiner

MULTILAYER SUBSTRATE AND METHOD FOR MANUFACTURING THE SAME

BACKGROUND

Technical Field

The present disclosure relates to a multilayer substrate including therein a via conductor having high dimensional accuracy and a method for manufacturing the same.

A multilayer substrate including therein a plurality of via conductors is described, for example, in Patent Document 1. For example, as illustrated in FIG. 8, a multilayer substrate 100 as disclosed in Patent Document 1 is formed by laminating a plurality of insulating resin layers 101 and mounting electrodes 103 for mounting a component 102 are formed on the upper surface of the multilayer substrate 100. Outer electrodes 104 for connecting the multilayer substrate 100 to a motherboard that is arranged on various electronic devices are formed on the lower surface of the multilayer substrate 100. The predetermined mounting electrodes 103 and outer electrode 104 are connected with via conductors 105 and wiring electrodes 106, which are formed in the multilayer substrate 100, interposed therebetween. The wirings provided in the multilayer substrate 100 have a three-dimensional structure in the above manner, so that the multilayer substrate 100 is tried to be reduced in size.

Patent Document 1: Japanese Unexamined Patent Application Publication No. 2008-300482 (see Paragraph 0018, FIG. 5 and the like)

BRIEF SUMMARY

With recent size reduction and increase in density of the component 102 that is mounted on the multilayer 100, decrease in a pitch of terminals of the component 102 has been accelerated. In order to mount the component 102, a pitch of the mounting electrodes 103 of the multilayer substrate 100 is also required to be decreased. However, in the existing multilayer substrate 100, the mounting electrodes 103 that are connected to the terminals of the component 102 are formed to have areas when seen from the above, which are larger than the areas of the end surfaces of the via conductors 105 connected just under the corresponding mounting electrodes 103. For this reason, the decrease in the pitch of the mounting electrodes 103 has been limited.

In order to realize mounting of the component 102 having the terminals arranged at a narrow pitch, a technology of directly connecting the end surfaces of the via conductors 105 to the terminals of the component 102 without necessarily providing the mounting electrodes 103 on the multilayer substrate 100 has been studied.

An example of a method for forming the via conductors will be described simply. First, predetermined positions of the insulating layers formed by ceramic green sheets or the like are irradiated with laser light from one main surface side of the insulating layers so as to form via holes passing through the insulating layers in the thickness direction thereof. In this case, the via holes are formed to have such truncated cone shapes that opening diameters at the one main surface side of the insulating layers as the laser light irradiation side are larger than opening diameters at the other main surface side thereof. The via conductors are formed by filling the via holes with a conductive paste from the openings at the large diameter side using a printing technology.

When the via conductors 105 are formed by the above-described method, the following problem has arisen in order to decrease the pitch of the via conductors 105 that are connected to the terminals of the component 102. That is to say, when the via holes are filled with the conductive paste, the conductive paste exudes from the openings of the via holes at the small diameter side in some cases, resulting in variation of dimensional accuracy of the via conductors 105. As a result, when a gap between the via conductors 105 is set, a margin for the variation of the dimensional accuracy is required to be ensured and this inhibits the decrease in the pitch of the via conductors 105.

The present disclosure has been made in view of the above-described problem and the present disclosure provides a technology of providing a multilayer substrate including a via conductor having high dimensional accuracy.

According to an aspect of the disclosure, there is provided a multilayer substrate including a multilayer body formed by laminating a plurality of insulating layers, the multilayer substrate including a via hole formed in a predetermined insulating layer which has been previously determined among the plurality of insulating layers so as to pass through the predetermined insulating layer, and a via conductor formed by filling the via hole with a conductive paste, wherein the via hole is formed through a lower end position, an upper end position, and an intermediate position between the lower end position and the upper end position such that a diameter enlargement degree (a degree of the increase of the diameter) toward the upper end position from the intermediate position is larger than a diameter enlargement degree toward the intermediate position from the lower end position.

In this case, the via hole formed so as to pass through the predetermined insulating layer is formed through the lower end position, the upper end position, and the intermediate position therebetween such that the diameter enlargement degree toward the upper end position from the intermediate position is larger than the diameter enlargement degree toward the intermediate position from the lower end position. Therefore, an opening diameter of the via hole at the lower side is smaller than an opening diameter thereof at the upper side.

Accordingly, for example, when the via hole is filled with the conductive paste from the opening at the lower side, which has the smaller diameter, using a printing technology or the like, filling pressure of the conductive paste that fills the via hole is lower than that when the via hole is filled with the conductive paste from the opening at the upper side, which has the larger diameter. The via hole is formed such that the diameter enlargement degree toward the upper end position from the intermediate position is larger than the diameter enlargement degree toward the intermediate position from the lower end position. Therefore, a portion of the via hole to the upper end position from the intermediate position is easier to be deformed by pressure when the conductive paste is printed in comparison with an existing via hole having a truncated cone shape with a constant enlargement degree. When the portion is deformed, an apparent volume in the via hole when it is filled with the paste is reduced. Accordingly, a filled amount of the conductive paste in the via hole is reduced.

Thus, the filling pressure and the filled amount of the conductive paste that fills the via hole are reduced so as to reduce an exudation amount of the conductive paste from the opening of the via hole at the upper side. With this, dimensional accuracy of the via conductor is improved and the multilayer substrate including the via conductor having high dimensional accuracy can be therefore provided.

Furthermore, the insulating layers may be formed with a ceramic material. In this case, as the material forming the insulating layers, for example, low temperature co-fired ceramics (LTCC) or the like can be used.

In addition, the via hole may be formed by continuously forming a lower side portion having a first truncated shape and an upper side portion having a second truncated shape. Even when the via hole is formed in this manner, the multilayer substrate including the via conductor having high dimensional accuracy can be provided in the same manner as described above.

The via hole may be formed such that an inner circumferential shape on a longitudinal cross section has a curve. Even when the via hole is formed in this manner, the multilayer substrate including the via conductor having high dimensional accuracy can be provided in the same manner as described above.

Furthermore, the predetermined insulating layer may be arranged as an uppermost layer of the multilayer body and an end surface of the via conductor at an upper surface side of the predetermined insulating layer may be exposed from a surface of the multilayer body. With this configuration, the exposed end surface of the via conductor can be used as a mounting electrode for mounting a component. In addition, the component having terminals arranged at a narrow pitch can be mounted because the improvement in the dimensional accuracy of the via conductor enables the pitch of the via conductors to be decreased. Moreover, connection strength to the component can be ensured while realizing the mounting of the component having the terminals arranged at the narrow pitch since the end surfaces of the via conductors having the larger diameter can be used as the mounting electrodes for mounting the component.

Furthermore, the end surface of the via conductor at the upper surface side of the predetermined insulating layer may be arranged at a recessed position in the via hole. The arrangement of the end surface of the via conductor at the recessed position in the via hole reduces the height of the component from the upper surface of the multilayer substrate by a recessed amount with which the end surface of the via conductor is arranged at the recessed position in the via hole when the end surface and the terminal of the component are directly connected by solder or the like, for example. Therefore, when the component is mounted on the multilayer substrate so as to configure a module, the module can be reduced in height. When the component is flip-chip-mounted, a solder bump of the component is positioned by the recess in the via hole and mounting property of the component can be therefore improved.

The end surface of the via conductor at the upper surface side of the predetermined insulating layer may be arranged at a position corresponding to the intermediate position of the via hole. The enlargement degree of the portion of the via hole to the upper end position from the intermediate position is larger than that of the portion thereof to the intermediate position from the lower end position. Accordingly, this configuration enables the solder bump or the like to be easy to enter the portion of the via hole to the upper end position from the intermediate position when the upper end surface of the via conductor and the terminal of the component are directly connected by the solder bump or the like.

Furthermore, according to another aspect of the disclosure, there is provided a method for manufacturing a multilayer substrate including a multilayer body formed by laminating a plurality of insulating layers, the method including preparing the plurality of insulating layers individually, wherein in the preparing of the insulating layers, when a predetermined insulating layer which has been previously determined is prepared, a via hole passing through the predetermined insulating layer is formed through a lower end position, an upper end position, and an intermediate position between the lower end position and the upper end position by laser processing such that a diameter enlargement degree toward the upper end position from the intermediate position is larger than a diameter enlargement degree toward the intermediate position from the lower end position, and then, a via conductor is formed by filling the via hole with a conductive paste from a small diameter side of the via hole.

In the method for manufacturing the multilayer substrate, when the predetermined insulating layer is prepared, the via hole passing through the predetermined insulating layer is formed through the lower end position, the upper end position, and the intermediate position therebetween by the laser processing so as to have such shape that the diameter enlargement degree toward the upper end position from the intermediate position is larger than the diameter enlargement degree toward the intermediate position from the lower end position. With this, an opening diameter of the via hole at the lower side is formed to be smaller than an opening diameter thereof at the upper side. Then, the via conductor is formed by filling the via hole with the conductive paste from the small diameter side of the via hole.

This method for forming the via conductor can make filling pressure of the conductive paste that fills the via hole be lower than that when the via hole is filled with the conductive paste from the large diameter side of the via hole. Furthermore, the via hole is formed to have such shape that the diameter enlargement degree toward the upper end position from the intermediate position is larger than the diameter enlargement degree toward the intermediate position from the lower end position. With the shape, a portion of the via hole to the upper end position from the intermediate position is deformed by pressure at the time of printing when the via hole is filled with the conductive paste using the printing technology, for example. When the portion is deformed, an apparent volume in the via hole when it is filled with the conductive paste is reduced. Accordingly, a filled amount of the conductive paste in the via hole can be reduced. Thus, the filling pressure and the filled amount of the conductive paste that fills the via hole are reduced so as to reduce exudation of the conductive paste from the large diameter side of the via hole. With this, the multilayer substrate including the via conductor having high dimensional accuracy can be provided.

Improvement in the dimensional accuracy of the via conductor enables a pitch between the via conductors to be set narrow. Therefore, a component having terminals arranged at a narrow pitch is easy to be mounted when the end surfaces of the via conductors are used as mounting electrodes for mounting the component. Furthermore, wiring density in the multilayer substrate can be increased by making the pitch between the via conductors narrow, thereby reducing the multilayer substrate in size.

According to the present disclosure, the via hole formed so as to pass through the predetermined insulating layer is formed through the lower end position, the upper end position, and the intermediate position between the lower end position and the upper end position such that the diameter enlargement degree toward the upper end position from the intermediate position is larger than the diameter enlargement degree toward the intermediate position from the lower end position. Therefore, the opening diameter of the via hole at the lower side is smaller than the opening diameter thereof at the upper side.

Accordingly, for example, when the via hole is filled with the conductive paste from the opening of the via hole at the small diameter side using the printing technology or the like, filling pressure of the conductive paste that fills the via hole is lower than that when the via hole is filled with the conductive paste from the opening of the via hole at the large diameter side. Furthermore, the via hole is formed such that the diameter enlargement degree toward the upper end position from the intermediate position is larger than the diameter enlargement degree toward the intermediate position from the lower end position. Therefore, a portion of the via hole to the upper end position from the intermediate position is easier to be deformed by pressure when the conductive paste is printed in comparison with an existing via hole having a truncated cone shape with a constant enlargement degree. When the portion is deformed, an apparent volume in the via hole when it is filled with the paste is reduced. Accordingly, a filled amount of the conductive paste in the via hole is reduced.

Thus, the filling pressure and the filled amount of the conductive paste that fills the via hole are reduced so as to reduce an exudation amount of the conductive paste from the opening of the via hole at the upper side. With this, dimensional accuracy of the via conductor is improved and the multilayer substrate including the via conductor having high dimensional accuracy can be provided.

DETAILED DESCRIPTION

<First Embodiment>

Figure 1:
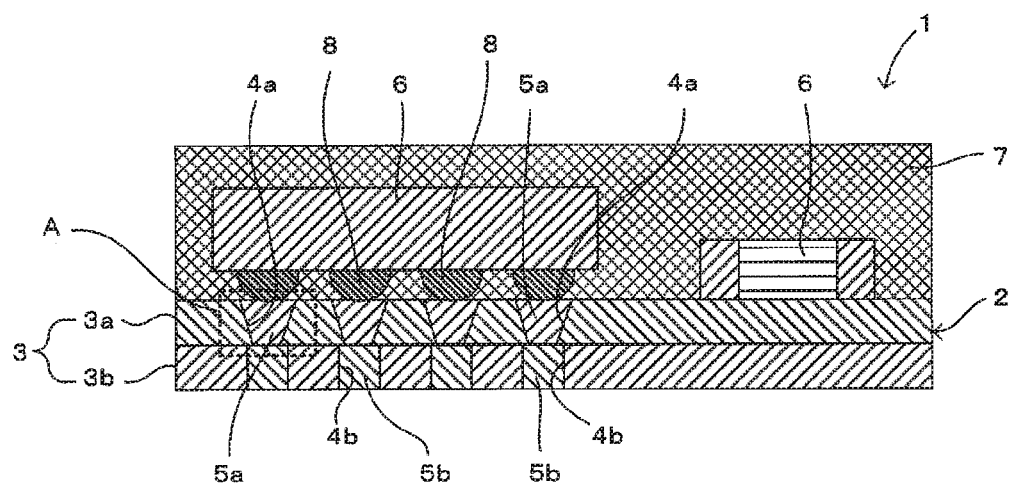
FIG. 1 is a cross-sectional view of a module including a multilayer substrate according to a first embodiment of the disclosure.
Figure 2:
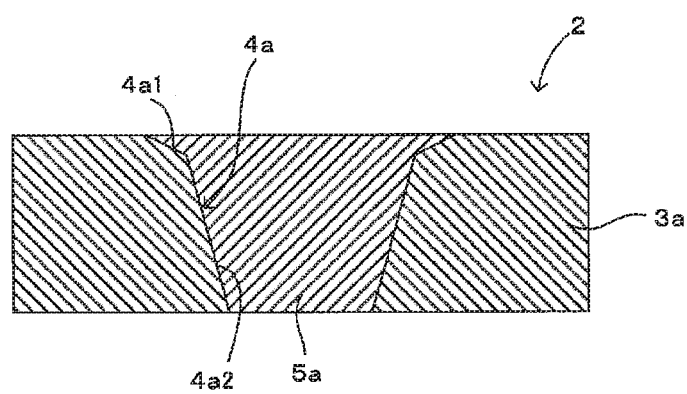
FIG. 2 is an enlarged cross-sectional view of a via conductor of FIG. 1.

A multilayer substrate 2 according to a first embodiment of the present disclosure will be described with reference to FIG. 1 and FIG. 2. FIG. 1 is a cross-sectional view of a module 1 including the multilayer substrate 2 in the first embodiment of the disclosure. FIG. 2 is an enlarged view of an A region of FIG. 1 and illustrates an enlarged cross-sectional view of a via conductor 5a and a periphery thereof.

As illustrated in FIG. 1, the multilayer substrate 2 in the embodiment includes a multilayer body 3 formed by laminating a plurality of (two in the embodiment) insulating layers 3a and 3b, a plurality of via holes 4a and 4b formed in the insulating layers 3a and 3b so as to pass through the insulating layers 3a and 3b, respectively, and via conductors 5a and 5b formed by filling the via holes 4a and 4b with a conductive paste, respectively. A component 6 is mounted on the upper surface of the multilayer substrate 2 and the upper surface of the multilayer substrate 2 and the component 6 are covered by a sealing resin layer 7. The multilayer substrate 2, the component 6, and the sealing resin layer 7 form the module 1. The number of insulating layers 3a and 3b configuring the multilayer substrate 2 can be appropriately changed.

The insulating layers 3a and 3b are formed with an insulating material such as ceramics and glass epoxy resin. The via conductors 5a and 5b are formed in the insulating layers 3a and 3b, respectively, and wiring electrodes (not illustrated) are formed on the main surfaces of the insulating layers 3a and 3b. In the embodiment, low temperature co-fired ceramics (LTCC) is used as the material forming the insulating layers 3a and 3b.

The via conductors 5a and 5b are formed by filling the via holes 4a and 4b formed so as to pass through the insulating layers 3a and 3b with the conductive paste containing metal such as Cu and Ag, respectively. In this case, each of the via holes 4a formed in the insulating layer 3a (corresponding to a "predetermined insulating layer" in the disclosure) as the uppermost layer is formed by continuously forming a lower side portion 4a2 having a first truncated cone shape and an upper side portion 4a1 having a second truncated cone shape, which have different enlargement degrees, as illustrated in FIG. 2. In other words, each via hole 4a is formed through a lower end position, an upper end position, and an intermediate position therebetween (boundary position between the upper side portion 4a1 and the lower side portion 4a2) such that a diameter enlargement degree toward the upper end position from the intermediate position is larger than a diameter enlargement degree toward the intermediate position from the lower end position.

The via hole 4a having the above-described shape is formed such that the opening diameter of the via hole 4a at the lower side is smaller than the opening diameter thereof at the upper side. Each via conductor 5a is formed by filling the via hole 4a with the conductive paste and is therefore formed to have the same shape as the shape of the via hole 4a. It should be noted that the upper side portion 4a1 and the lower side portion 4a2 of the via hole 4a may be formed to have truncated pyramid shapes.

Furthermore, the upper end surfaces of the via conductors 5a are exposed from the surface (upper surface) of the multilayer body 3 and the end surfaces are used as mounting electrodes for mounting the component 6. That is to say, the upper end surfaces of the via conductors 5a and terminals of the component 6 are directly connected with solders 8 interposed therebetween. The via conductors 5a formed in the insulating layer 3a as the uppermost layer correspond to a "via conductor" in the disclosure.

Meanwhile, each via hole 4b that is formed in the insulating layer 3b at the lower side is formed to have a cylindrical shape and each via conductor 5b formed by filling the via hole 4b with the conductive paste is also formed to have a cylindrical shape. It should be noted that the via hole 4b may be also formed to have the same shape as the via hole 4a formed in the insulating layer 3a as the uppermost layer.

The component 6 is a chip component such as a semiconductor element, a chip capacitor, and a chip inductor formed with Si, GaAs, or the like, and is mounted on the upper surface of the multilayer substrate 2 by a surface mount technology, such as surface mount technologies already known in the art.

The sealing resin layer 7 is formed by epoxy resin, for example, and is provided in order to protect the upper surface of the multilayer substrate 2 and the component 6. The sealing resin layer 7 can be formed by a coating method, a printing method, a compression mold method, a transfer mold method, or the like.

(Method for Manufacturing Multilayer Substrate 2)

A method for manufacturing the multilayer substrate 2 in the embodiment will be described with reference to FIGS. 3A-3F. FIGS. 3A-3F are views for explaining the method for manufacturing the multilayer substrate 2. FIGS. 3A to 3F are views corresponding to FIG. 2. The manufacturing method as will be described below can be also applied to a method for manufacturing a multilayer substrate 1a according to a second embodiment, which will be described later.

Figure 3A:
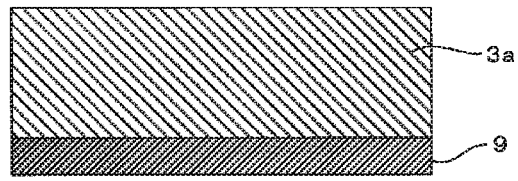
FIGS. 3A-3F are views for explaining a method for manufacturing the multilayer substrate of FIG. 1.

The method for manufacturing the multilayer substrate 2 includes an insulating layer preparation process of individually preparing the insulating layers 3a and 3b configuring the multilayer body 3. For example, the case where the insulating layer 3a arranged as the uppermost layer is prepared is described. First, as illustrated in FIG. 3A, slurry obtained by mixing mixed powder of alumina, glass, and the like together with an organic binder and a solvent is flowed to spread and molded onto a carrier film 9 so as to prepare the insulating layer 3a (what-is-called, ceramic green sheet) with the carrier film 9, which has been shaped into a sheet form.

Figure 3B:
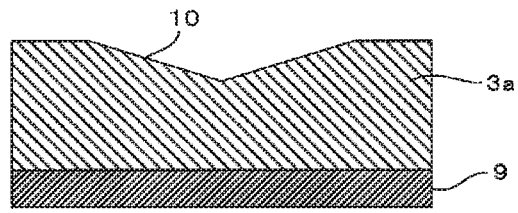

Then, as illustrated in FIG. 3B, the insulating layer 3a is irradiated with laser light from the side of the surface (hereinafter, also may be referred to an upper surface of the insulating layer 3a) of the insulating layer 3a at the opposite side to the surface thereof opposing the carrier film 9. With this, recesses 10 are formed at predetermined positions in the insulating layer 3a (first laser irradiation process). At this time, laser irradiation conditions (for example, diaphragm, intensity, and irradiation time) are set such that the opening diameters of the recesses 10 are the same as the opening diameters of the via holes 4a at the upper side, which will be formed later.

Figure 3C:
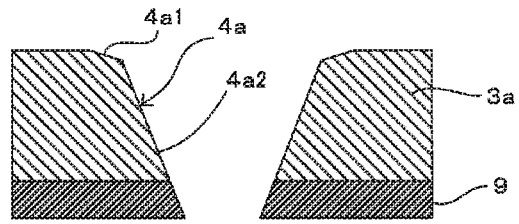

Subsequently, as illustrated in FIG. 3C, the via holes 4a passing through the insulating layer 3a and the carrier film 9 are formed by irradiating them with the laser light under changed irradiation conditions while keeping the irradiation positions of the laser light in the first laser irradiation process (second laser irradiation process). The irradiation conditions of the laser light at this time are set so as to form the via holes 4a through the lower end positions, the upper end positions, and the intermediate positions therebetween such that the diameter enlargement degree toward the upper end positions from the intermediate positions is larger than the diameter enlargement degree toward the intermediate positions from the lower end positions. With the two-stage laser processing, the via holes 4a formed by continuously forming the lower side portions 4a2 having the first truncated cone shapes and the upper side portions 4a1 having the second truncated cone shapes, which have different enlargement degrees, are formed.

Figure 3D:
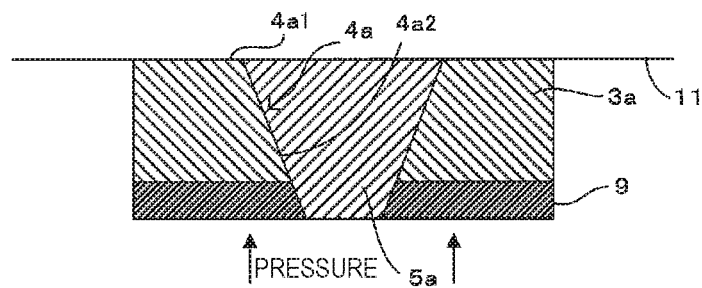
Figure 3E:
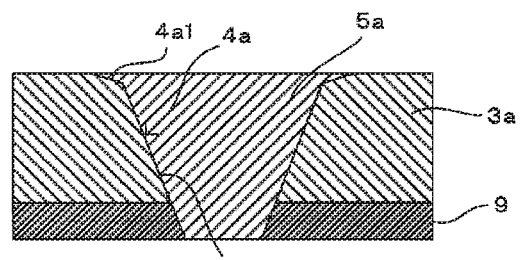
Figure 3F:
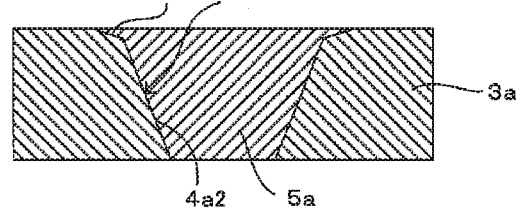

Then, as illustrated in FIG. 3D, inner portions of the via holes 4a are filled with the conductive paste containing metal such as Cu and Ag using the printing technology so as to form the via conductors 5a. To be specific, the via holes 4a are filled with the conductive paste from the carrier film 9 side (smaller diameter side of the via holes 4a) in a state where a adhering surface 11 as a stage of a printing device is made to adhere the upper surface of the insulating layer 3a. At this time, the upper side portions 4a1 of the via holes 4a are deformed by pressure by the squeegee of the printing device and the upper side portions 4a1 are made substantially close contact with the adhering surface 11 of the printing device. The via holes 4a in this state are filled with the conductive paste.

When the adherence by the printing device is released, the upper side portions 4a1 of the via holes 4a are returned into original shapes. In this case, the upper side portions 4a1 of the via holes 4a are also filled with the conductive paste by residual pressure of the filling pressure of the conductive paste in the via holes 4a, so that the via conductors 5a are formed (see FIG. 3E).

Thereafter, wiring electrodes are formed on the upper surface of the insulating layer 3a using a printing technology or the like. Finally, the insulating layer 3a is detached from the carrier film 9 so as to complete the insulating layer 3a. When the carrier film 9 is detached, a part of the lower end portions of the via conductors 5a is caught by the carrier film 9 and the via conductors 5a are broken off in some cases. However, in the embodiment, the via conductors 5a at the small diameter side make contact with the carrier film 9, thereby preventing or reducing being broken off of the via conductors 5a when the carrier film 9 is detached.

The insulating layer 3b at the lower layer side is prepared by the same method. In this case, the columnar via holes 4b can be formed by punching processing.

The insulating layers 3a and 3b prepared as described above are stacked in the predetermined order and pressed so as to form the multilayer body 3.

Finally, the multilayer body 3 is baked at a predetermined temperature (for example, 850° C.). This completes the multilayer substrate 2. The manufacturing method can be also applied to the case where an assembly of a plurality of multilayer substrates 2 is formed. In this case, it is sufficient that after the insulating layers 3a and 3b are stacked and pressed, division grooves for dividing the assembly into the individual multilayer substrates 2 are formed by cutting with a dicing machine and so on.

Accordingly, with the above-described embodiment, the via holes 4a formed so as to pass through the insulating layer 3a as the uppermost layer are formed through the lower end positions, the upper end positions, and the intermediate positions therebetween such that the diameter enlargement degree toward the upper end positions from the intermediate positions is larger than the diameter enlargement degree toward the intermediate positions from the lower end positions. Therefore, the opening diameters of the via holes 4a at the lower side are smaller than the opening diameters thereof at the upper side.

Accordingly, when the via holes 4a are filled with the conductive paste from the openings thereof at the small diameter side (openings at the lower side) using the printing technology or the like, the filling pressure of the conductive paste that fills the via holes 4a is lower than that when the via holes 4a are filled with the conductive paste from the openings thereof at the large diameter side (openings at the upper side). The via holes 4a are formed such that the diameter enlargement degree toward the upper end positions from the intermediate positions is larger than the diameter enlargement degree toward the intermediate positions from the lower end positions as described above. Therefore, the portions (upper side portions 4a1) of the via holes 4a to the upper end positions from the intermediate positions are easier to be deformed by pressure when the conductive paste is printed in comparison with an existing via hole having a truncated cone shape with a constant enlargement degree. When the portions 4a1 are deformed, apparent volumes in the via holes 4a when they are filled with the paste are reduced. Accordingly, a filled amount of the conductive paste in the via holes 4a is reduced.

Thus, the filling pressure and the filled amount of the conductive paste that fills the via holes 4a are reduced so as to reduce an exudation amount of the conductive paste from the openings of the via holes 4a at the large diameter side. With this, dimensional accuracy of the via conductors 5a is improved and the multilayer substrate 2 including the via conductors 5a having high dimensional accuracy can be therefore provided.

Furthermore, the upper end surfaces of the via conductors 5a formed in the insulating layer 3a as the uppermost layer are exposed from the surface of the multilayer body 3, so that the upper end surfaces of the via conductors 5a can be used as mounting electrodes for mounting the component. In addition, the component 6 having the terminals arranged at a narrow pitch can be mounted because the improvement in the dimensional accuracy of the via conductors 5a enables the pitch between the via conductors 5a, that is, the pitch between the mounting electrodes to be decreased. Moreover, connection strength to the component 6 can be ensured while realizing the mounting of the component 6 having the terminals arranged at the narrow pitch since the end surfaces (upper end surfaces) of the via conductors 5a at the large diameter side are used as the mounting electrodes for mounting the component.

In addition, with the above-described method for manufacturing the multilayer substrate 2, when the insulating layer 3a as the uppermost layer is prepared, the via holes 4a passing through the insulating layer 3a are formed through the lower end positions, the upper end positions, and the intermediate positions therebetween so as to have such shapes that the diameter enlargement degree toward the upper end positions from the intermediate positions is larger than the diameter enlargement degree toward the intermediate positions from the lower end positions. Then, the via holes 4a are filled with the conductive paste from the small diameter side so as to form the via conductors 5a.

This method can make the filling pressure of the conductive paste that fills the via holes 4a be lower than that when the via holes 4a are filled with the conductive paste from the large diameter side of the via holes 4a. Furthermore, the via holes 4a are formed to have such shapes that the diameter enlargement degree toward the upper end positions from the intermediate positions is larger than the diameter enlargement degree toward the intermediate positions from the lower end positions. With the shapes, the portions (upper side portions 4a1) of the via holes 4a to the upper end positions from the intermediate positions are deformed by pressure at the time of printing when the via holes 4a are filled with the conductive paste using the printing technology. When the portions 4a1 are deformed, the apparent volumes in the via holes 4a when they are filled with the conductive paste are reduced. Accordingly, a filled amount of the conductive paste in the via holes 4a can be reduced. Thus, the filling pressure and the filled amount of the conductive paste that fills the via holes 4a are reduced so as to reduce exudation of the conductive paste from the large diameter side of the via holes 4a. With this, the multilayer substrate 2 including the via conductors 5a having high dimensional accuracy can be manufactured. Reduction in the amount of the conductive paste that fills the via holes 4a can suppress rising of the via conductors 5a, which occurs in baking of the multilayer body 3.

The dimensional accuracy of the via conductors 5a is improved, so that a pitch of the upper end surfaces of the via conductors 5a to be used as the mounting electrodes of the component 6 can be set to be narrower. This enables the multilayer substrate 2 capable of realizing the mounting of the component having the electrodes arranged at a narrow pitch to be manufactured. Furthermore, wiring density in the multilayer substrate is increased by making the pitch between the via conductors narrow, thereby manufacturing the multilayer substrate 2 having the smaller size than the existing multilayer substrate.

<Second Embodiment>

Figure 4:
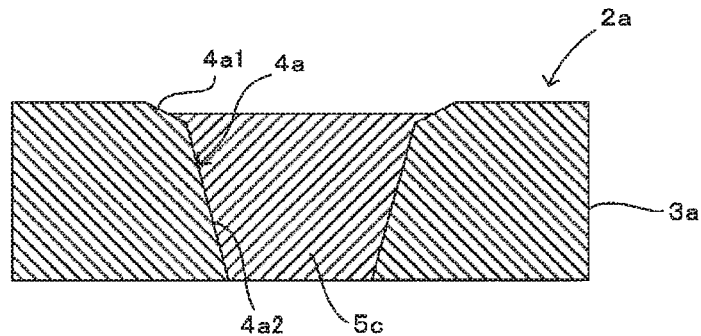
FIG. 4 is a partial cross-sectional view of a multilayer substrate according to a second embodiment of the disclosure.

A multilayer substrate 2a according to the second embodiment of the disclosure will be described with reference to FIG. 4. FIG. 4 is a partial cross-sectional view of the multilayer substrate 2a and is a view corresponding to FIG. 2.

The multilayer substrate 2a in the embodiment is different from the multilayer substrate 1 in the first embodiment as described with reference to FIG. 1 and FIG. 2 in a point that the upper end surfaces of via conductors 5c formed in the insulating layer 3a as the uppermost insulating layer 3a are arranged at recessed positions in the via holes 4a as illustrated in FIG. 4. Other configurations thereof are the same as those of the multilayer substrate 1 in the first embodiment and description thereof is omitted while they are denoted with the same reference numerals.

The upper end surfaces of the via conductors 5c are arranged at the recessed positions in the via holes 4a as described above. With this arrangement, when the upper end surfaces of the via conductors 5c and the terminals of the component 6 are directly connected by solder bumps or the like, the height of the component 6 from the upper surface of the multilayer substrate la is reduced by a recessed amount with which the upper end surfaces of the via conductors 5c are arranged at the recessed positions in the via holes 4a. Therefore, the module 1 formed by mounting the component 6 on the multilayer substrate la can be reduced in height.

When the component 6 is flip-chip-mounted, the solder bumps of the component 6 are positioned by the recesses in the via holes 4a and mounting property of the component 6 can be therefore improved.

(Variation on Via Conductors 5c)

Figure 5:
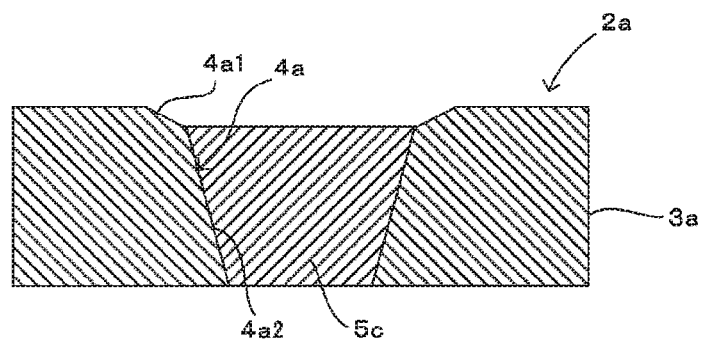
FIG. 5 is a view illustrating a variation on a via conductor of FIG. 4.

The upper end surfaces of the via conductors 5c may be arranged at positions corresponding to the boundaries between the upper side portions 4a1 and the lower side portions 4a2, which are the intermediate positions of the via holes 4a, as illustrated in FIG. 5. The upper side portions 4a1 of the via holes 4a are formed to have larger enlargement degree than that of the lower side portions 4a2. Accordingly, the above-described configuration enables the solder bumps or the like to be easy to enter the upper side portions 4a1 of the via holes 4a when the upper end surfaces of the via conductors 5c and the terminals of the component 6 are directly connected by the solder bumps or the like. It should be noted that FIG. 5 is a view illustrating a variation on the via conductor 5c in FIG. 4.

(Variations of Via Hole)

Figure 6:
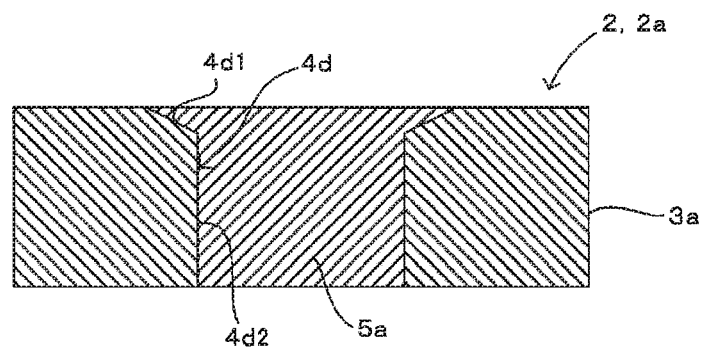
FIG. 6 is a view illustrating a variation on a via hole.
Figure 7:
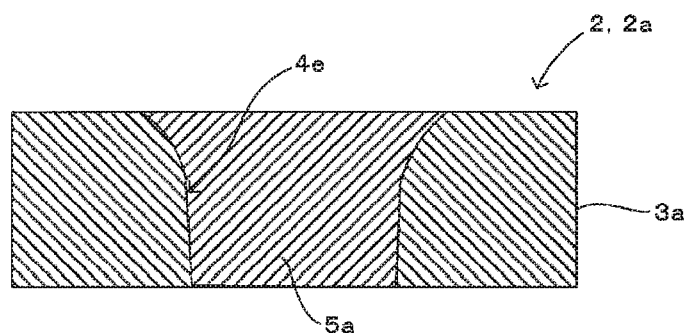
FIG. 7 is a view illustrating another variation on the via hole.
Figure 8:
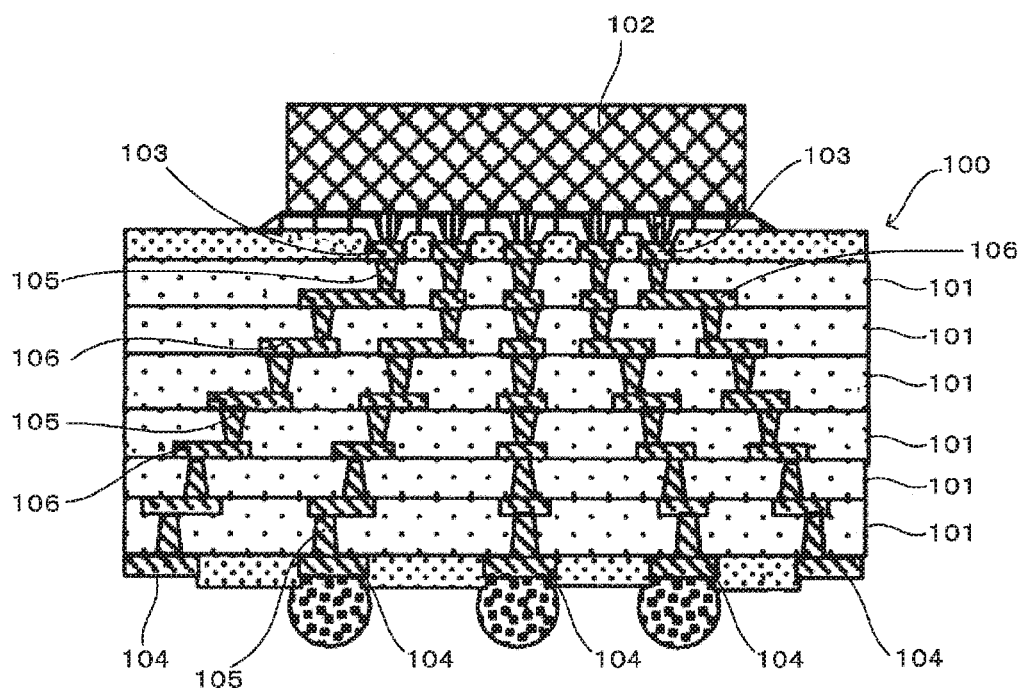
FIG. 8 is a cross-sectional view of an existing multilayer substrate.

Next, variations of the via hole will be described with reference to FIG. 6 and FIG. 7. FIG. 6 and FIG. 7 are views illustrating the variations on the via hole and both are views corresponding to FIG. 2.

In each of the above-described embodiments, each via hole 4a is formed by continuously forming the lower side portion 4a2 having the first truncated cone shape and the upper side portion 4a1 having the second truncated cone shape, which have different enlargement degrees. Alternatively, as illustrated in FIG. 6, a via hole 4d may be formed such that a upper side portion 4d1 has a truncated cone shape and a lower side portion 4d2 has a cylindrical shape.

Furthermore, as illustrated in FIG. 7, a via hole 4e may be formed such that an inner circumferential shape on a longitudinal cross section has a curve. In these cases, the same effects as those obtained by the multilayer substrates 2 and 2a in the above-described embodiments can be obtained.

The disclosure is not limited to the above-described embodiments and various changes can be made in addition to those as described above as long as they do not depart from the scope of the disclosure. For example, in each of above-described embodiments, the via holes 4a formed by the upper side portions 4a1 and the lower side portions 4b2, which have different enlargement degrees, are formed by two-time laser processing under the different laser irradiation conditions. However, the above-described via holes 4a can be also formed by one-time laser processing by adjusting diaphragm, intensity, irradiation time, and the like of the laser light. This can simplify the manufacturing process of the multilayer substrate 2 or 2a.

INDUSTRIAL APPLICABILITY

The present disclosure can be applied to various multilayer substrates including therein via conductors.

REFERENCE SIGNS LIST 2, 2a MULTILAYER SUBSTRATE
3 MULTILAYER BODY
3a, 3b INSULATING LAYER
4a, 4b, 4d, 4e VIA HOLE
4a1, 4d1 UPPER SIDE PORTION
4a2, 4d2 LOWER SIDE PORTION
5a, 5b, 5c VIA CONDUCTOR

The invention claimed is:

1. A multilayer substrate including a multilayer body having a plurality of laminated insulating layers, the multilayer substrate comprising:
a via hole provided in a predetermined insulating layer which has been previously determined among the plurality of insulating layers so as to pass through the predetermined insulating layer; and
a via conductor provided as a conductive paste filling the via hole,
wherein the plurality of laminated insulating layers includes a lower insulating layer and an upper insulating layer laminated on the lower insulating layer,
wherein the via hole has an upper side portion having a truncated cone shape and a lower side portion having a cylindrical shape, and the upper side portion of the via hole is formed in the upper insulating layer and the lower side portion of the via hole is formed in the lower insulating layer,
wherein the upper side portion of the via hole is provided through a lower end position, an upper end position, and an intermediate position between the lower end position and the upper end position, a diameter of the upper side portion of the via hole is enlarged from the lower end position to the intermediate position and from the intermediate position to the upper end position, and a diameter enlargement degree toward the upper end position from the intermediate position is larger than a diameter enlargement degree toward the intermediate position from the lower end position,
wherein a length of a lower side line elongated from the lower end position to the intermediate position of the upper side portion of the via hole is longer than a length of an upper side line elongated from the intermediate position to the upper end position of the upper side portion of the via hole.

2. The multilayer substrate according to claim 1, wherein the insulating layers comprise a ceramic material.

3. The multilayer substrate according to claim 1, wherein an inner circumferential shape of the via hole on a longitudinal cross section has a curve.

4. The multilayer substrate according to claim 1, wherein the predetermined insulating layer is arranged at an uppermost layer of the multilayer body, and an end surface of the via conductor at an upper surface side of the predetermined insulating layer is exposed from a surface of the multilayer body, and
wherein the exposed end surface of the via conductor is an amounting electrode.

5. The multilayer substrate according to claim 4, wherein the end surface of the via conductor at the upper surface side of the predetermined insulating layer is arranged at a recessed position in the via hole.

6. The multilayer substrate according to claim 5, wherein the end surface of the via conductor at the upper surface side of the predetermined insulating layer is arranged at a position corresponding to the intermediate position of the via hole.

7. A method for manufacturing a multilayer substrate including a multilayer body having a plurality of laminated insulating layers, the method comprising:
preparing the plurality of insulating layers individually,
wherein in the preparing of the insulating layers, when a predetermined insulating layer which has been previously determined is prepared, a via hole passing through the predetermined insulating layer is provided with a lower end position, an upper end position, and an intermediate position between the lower end position and the upper end position provided by laser processing, a diameter of the via hole is enlarged from the lower end position to the intermediate position and from the intermediate position to the upper end position, and a diameter enlargement degree toward the upper end position from the intermediate position is larger than a diameter enlargement degree toward the intermediate position from the lower end position,
wherein the plurality of insulating layers includes a lower insulating layer and an upper insulating layer laminated on the lower insulating layer,
wherein the via hole has an upper side portion having a truncated cone shape and a lower side portion having a cylindrical shape, the upper side portion of the via hole is formed in the upper insulating layer and the lower side portion of the via hole is formed in the lower insulating layer,
wherein a length of a lower side line elongated from the lower end position to the intermediate position of the upper side portion of the via hole is longer than a length of an upper side line elongated from the intermediate position to the upper end position of the upper side portion of the via hole, and then,
a via conductor is provided as a conductive paste filling the via hole from a small diameter side of the via hole.

8. The multilayer substrate according to claim 2, wherein an inner circumferential shape of the via hole on a longitudinal cross section has two substantially straight lines each corresponding to a lower side portion from the lower end position to the intermediate position and an upper side portion from the intermediate position to the upper end position.

9. The multilayer substrate according to claim 2, wherein an inner circumferential shape of the via hole on a longitudinal cross section has a curve.

10. The multilayer substrate according to claim 2, wherein the predetermined insulating layer is arranged at an uppermost layer of the multilayer body, and an end surface of the via conductor at an upper surface side of the predetermined insulation layer is exposed from a surface of the multilayer body.

11. The multilayer substrate according to claim 1, wherein the predetermined insulating layer is arranged at an uppermost layer of the multilayer body, and an end surface of the via conductor at an upper surface side of the predetermined insulating layer is exposed from a surface of the multilayer body.

12. The multilayer substrate according to claim 3, wherein the predetermined insulating layer is arranged at an uppermost layer of the multilayer body, and an end surface of the via conductor at an upper surface side of the predetermined insulating layer is exposed from a surface of the multilayer body.

13. A module comprising the multilayer substrate according to claim 1, wherein the predetermined insulating layer consists of a single insulating layer.

14. A module comprising the multilayer substrate according to claim 1, wherein the exposed end surface of the via conductor is a mounting electrode.

* * * * *